United States Patent [19]
Tsou

[11] Patent Number: 5,286,337
[45] Date of Patent: Feb. 15, 1994

[54] REACTIVE ION ETCHING OR INDIUM TIN OXIDE

[75] Inventor: Len Y. Tsou, New City, N.Y.

[73] Assignee: North American Philips Corporation, New York, N.Y.

[21] Appl. No.: 8,116

[22] Filed: Jan. 25, 1993

[51] Int. Cl.$^5$ .............................................. B01J 15/00
[52] U.S. Cl. ................................. 1156/643; 156/646; 204/192.35
[58] Field of Search .............................. 156/643, 646; 204/192.35

[56] References Cited

U.S. PATENT DOCUMENTS

| | | |
|---|---|---|
| 3,979,240 | 9/1976 | Ghezzo . |
| 4,256,534 | 3/1981 | Levinstein et al. ............ 156/643 |
| 4,784,720 | 11/1988 | Douglas . |
| 4,793,894 | 12/1988 | Jacco et al. . |
| 4,878,993 | 11/1989 | Rossi et al. . |
| 5,007,982 | 4/1991 | Tsou . |
| 5,032,221 | 7/1991 | Roselle et al. ................. 156/646 X |
| 5,171,401 | 12/1992 | Roselle ......................... 156/646 X |

OTHER PUBLICATIONS

Mohri et al., Plasma Etching of ITO Thin Films Using a CH$_4$/H$_2$ Gas Mixture, Japanese Journal of Applied Physics, vol. 29, No. 10, Oct. 1990, pp. L1932-L1935.

Kuo et al., Reactive Ion Etching of Indium Tin Oxide with Flourochlorocarbon Gases, Proceedings Electrochemical Society 1990, pp. 765-772.

Calahorra et al., Reactive Ion Etching of Indium-Tin-Oxide Films, J. Electchem Soc. vol. 136, No. 6, Jun. 1989, pp. 1839-1840.

*Primary Examiner*—Thi Dang
*Attorney, Agent, or Firm*—Norman N. Spain

[57] ABSTRACT

Indium tin oxide films deposited on substrates are subjected to reactive ion etching in a plasma containing dissociated hydrogen bromide or a mixture of dissociated hydrogen bromide and dissociated boron tinchloride.

24 Claims, 2 Drawing Sheets

REACTIVE ION ETCHING OR INDIUM TIN OXIDE

BACKGROUND OF THE INVENTION

The invention in this case related to a new and improved method of etching indium tin oxide films.

Indium tin oxide ($In_2O_3$:Sn) hereinafter termed ITO is particularly adapted, when used in thin film form, for use as transparent electrode for display devices in particular optoelectric devices such as liquid crystal displays, electroluminescent devices, and image sensors. Further electrodes formed of patterned thin film ITO are also particularly adapted for use on various semiconductor devices.

ITO electrodes are commonly formed by depositing a thin film of ITO on a desired substrate, providing a patterned photoresist layer on thin film ITO, etching the ITO film through the photoresist layer with an etchant that etches the ITO film at a significantly faster rate than the photoresist layer and the substrate.

In the past, frequently wet etching of ITO films with solutions of HI, HCl, oxalic acid and mixtures of HCl and $HNO_3$ have been carried out. However, these wet etching methods have not proved to be successful. Since wet etching is carried out by a reaction which proceeds isotropically, overetching of the patterned photoresist layer frequently occurs resulting in poorly defined and incomplete etch patterns of the ITO films.

Mohri et al Japanese Journal of Applied Physics Vol. 29, No. 10, October 1990, pp L1932-L1935 teaches the etching of ITO thin films with a plasma etching using a $CH_4/H_2$ gas mixture. While etching with such a plasma results in the production of fine ITO patterns it has the defect in that some polymerization of the $CH_4$ occurs resulting in contamination of the resultant ITO pattern.

Kuo et al Proceedings Electrochemical Society 1990 90 (14 pp. 765-772) shows reactive ion etching with fluorochlorocarbon gases such as $CF_3Cl$ or $CF_2Cl_2$. While such a method also results in the formation of finely etched ITO patterns it also has the defect of contamination due to polymerization of the fluorochlorocarbon gases. In addition these gases are considered to be harmful to the environment, their use is being severely restricted and may be entirely banned in the near future.

Calahorra et al J. Electrochem. Soc., Vol. 136, No. 6, June 1989 pp 1839-1840 shows reactive ion etching of ITO films with HI gas. Such a method results in the production of finely etched ITO patterns. However HI gas is dangerous to use since HI gas is unstable tending to form the explosive $H_2$.

Ghezzo U.S. Pat. No. 3,979,240 shows etching of ITO films with a concentrated solution of HBr. While this method shows improved ITO patterns as compared with other wet etching methods, the etching still procedes isotropically resulting in patterns that are insufficiently fine and homogeneous for many purposes.

Rossi et al U.S. Pat. No. 4,878,993 shows sputter etching of ITO films with a plasma consisting of dissociated argon.

SUMMARY OF THE INVENTION

A principal object of this invention is to provide a new and improved method of etching ITO films, deposited on a substrate, that is free or almost entirely free of the above-described defects of the prior art methods.

This and other objects of the invention will be apparent from the description that follows.

According to the method of the invention finely etched and highly homogeneous patterns are produced in ITO films deposited on substrates by subjecting such films to reactive ion etching with a plasma comprising dissociated hydrogen bromide or a mixture of dissociated hydrogen bromide and dissociated boron trichloride.

Reactive ion etching of a silicon substrate with a HBr plasma is known from Tsou U.S. Pat. No. 5,007,982 and with a plasma containing HBr and $BCl_3$ from Douglas U.S. Pat. No. 4,784,720. However neither of these references suggest etching of ITO.

The method of the instant invention is particularly useful for providing ITO patterns on silicon dioxide substrates especially quartz in part because the etch rate of ITO is significantly faster than of silicon dioxide when the etching method of the invention is employed. However by use of the method of the invention finely etched and homogenous patterns may be produced in ITO films deposited on various other substrates including for example silicon, silicon nitride, borosilicate glass and metals such as aluminum, chromium and molybdenum.

DETAILED DESCRIPTION OF THE INVENTION

Figure 1A:
FIGS. 1a, 1b, 1c and 1d are cross-sectional views illustrating various steps of the method of the invention.

Etching of ITO films deposited directly on quartz or another silicon dioxide substrate may be carried out according to the method of the invention employing either a plasma containing a mixture of dissociated HBr and dissociated $BCl_3$ or a plasma containing no dissociated $BCl_3$.

However it has been found that when the substrate is quartz and the plasma contains no dissociated $BCl_3$, unwanted residues of ITO remain on the substrate. These residues correspond to images of recessed areas on the bottom electrode of the electrode pair used in carrying out the reactive ion etching method of the invention. Such recessed areas are caused by the presence of screws or pedestals attached to the surface of the electrode.

When the substrate is silicon, the ITO film may be directly deposited on the substrate and etching carried out with a plasma containing dissociated HBr with or without dissociated $BCl_3$ without unwanted ITO residues remaining on the surface of the substrate.

However the etch rate for silicon employing the reactive ion etching method of the invention is only a factor of 2 or 3 smaller than for ITO, making it difficult to control the etching of the ITO layer relative to the etching of the silicon substrate.

In general, for the manufacture of devices, a thin layer of silicon dioxide is provided between the silicon substrate and the ITO layer.

The silicon dioxide layer may be readily formed by suitable oxidation of the surface of the silicon substrate or by chemical vapor deposition (CVD).

A suitable thickness of the silicon dioxide layer is 200 Å-500 Å.

The layer of ITO generally is about 500 Å–5000 Å thick.

A suitable method for depositing the ITO layer is by sputtering.

With a plasma containing HBr only, there is no residue on the substrate, when a thin electrically conductive layer of a thickness of about 1000 Å–5000 Å is deposited on the quartz substrate prior to the deposition of the ITO layer. Such a layer may be formed of, a conductive metal for example, of Mo, Al or Ag.

In order to form a desired pattern in the ITO layer, etching is generally carried through a suitable patterned photoresist. Examples of suitable photoresists are Kodak 820, Kodak 809 and Shipley AZ-1470.

With a plasma containing only, as the etchant, dissociated HBr, an etch rate of up to 500 Å/Min of ITO may be achieved.

The flow rate ratio of $BCl_3$/HBr that may be employed ranges from about 1/10 to 10/1, a ratio of ⅓ to 3/1 being preferred.

The presence of $BCl_3$ reduces the etch rate somewhat. As a result with a $BCl_3$/HBr ratio of 1:1 the etch rate is 80% of that achieved with pure HBr.

Generally, a gas flow of 10–100SCCM and a gas pressure of 50-200 Mtorr with an RF power of 100–500 watts is employed. Under these conditions, an etch rate of ITO of 100–500 Å/Min is achieved.

For a more complete understanding, the invention will now be described in greater detail with reference to the following drawing in the FIGS. 1a-1d of the drawing, which are not in accordance with scale.

EXAMPLE

Referring to FIG. 1a of the drawing, a thin silicon dioxide layer 1 of a thickness of 1000 Å was provided on the surface of a silicon wafer 2. The silicon dioxide layer 1 was formed by thermal oxidation on the surface of the silicon wafer 2. An ITO layer 3 of a thickness of 1100 Å was sputter deposited at 300° C. on the silicon dioxide layer 1 and then annealed in air at 300° C. for 30 minutes.

Figure 1B:
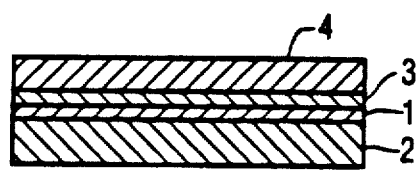

A positive photoresist layer 4, Kodak 820 was then deposited on the layer 3 of ITO. The resultant structure formed is as shown in FIG. 1b.

Figure 1C:
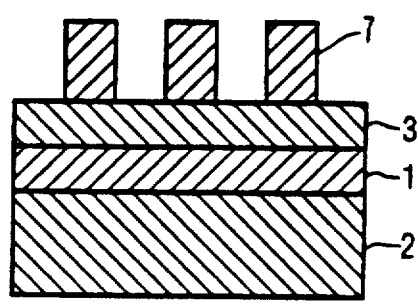

The photoresist layer 4 was then subjected to patterned photolithography by an ASM stepper so as to provide a patterned photoresist layer 7 on the ITO layer 3 having lines of a width of 2.0μ and spacings of about 2.0μ. This structure is shown in FIG. 1c. The structure shown in FIG. 1c was then subjected to reactive ion etching in the following manner.

The structure shown in FIG. 1c was placed in a temperature-controlled electrode of a single wafer reactive ion etcher such as a Plasma-Therm in-line-etcher, model-360. The temperature of the electrode bearing the structure shown in FIG. 1c was set at 25° C.

Etching was carried out with a plasma containing only dissociated HBr at an RF power of 200W, a pressure of 100 mtorr, with a gas flow of 80 SCCM.

The etch rates for the ITO layer 3, the patterned photoresist layer 7 and the silicon dioxide layer 1 was determined by a Dektak or Nanospec.

The etch rate was found to be 350 Å/Min for the ITO layer 3, 300 Å/Min for the photoresist layer 4 and 100 Å/Min for the $SiO_2$ layer 1.

After 3 minutes, the etching of the ITO layer 3 was shown to be complete as determined by detection of the emission spectra peak at 325nm.

Figure 1D:
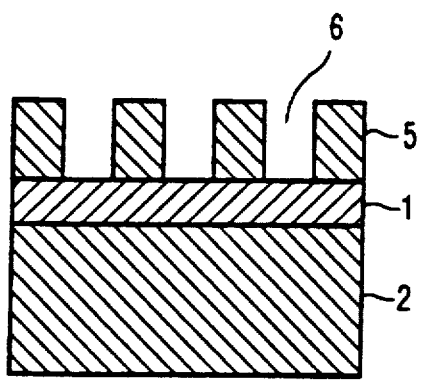

The patterned photoresist layer 7 was then removed by an oxygen plasma followed by cleaning with a mixture of $H_2SO_4$ and $H_2O_2$. The resulting structure is shown in FIG. 1d.

This structure consisted of ITO electrodes 6 of a thickness of 1100 Å and a width of 1.9μ and with spacings 5 between these electrodes of 2.1μ.

No etching of the $SiO_2$ layer was indicated to have taken place.

Figure 2:
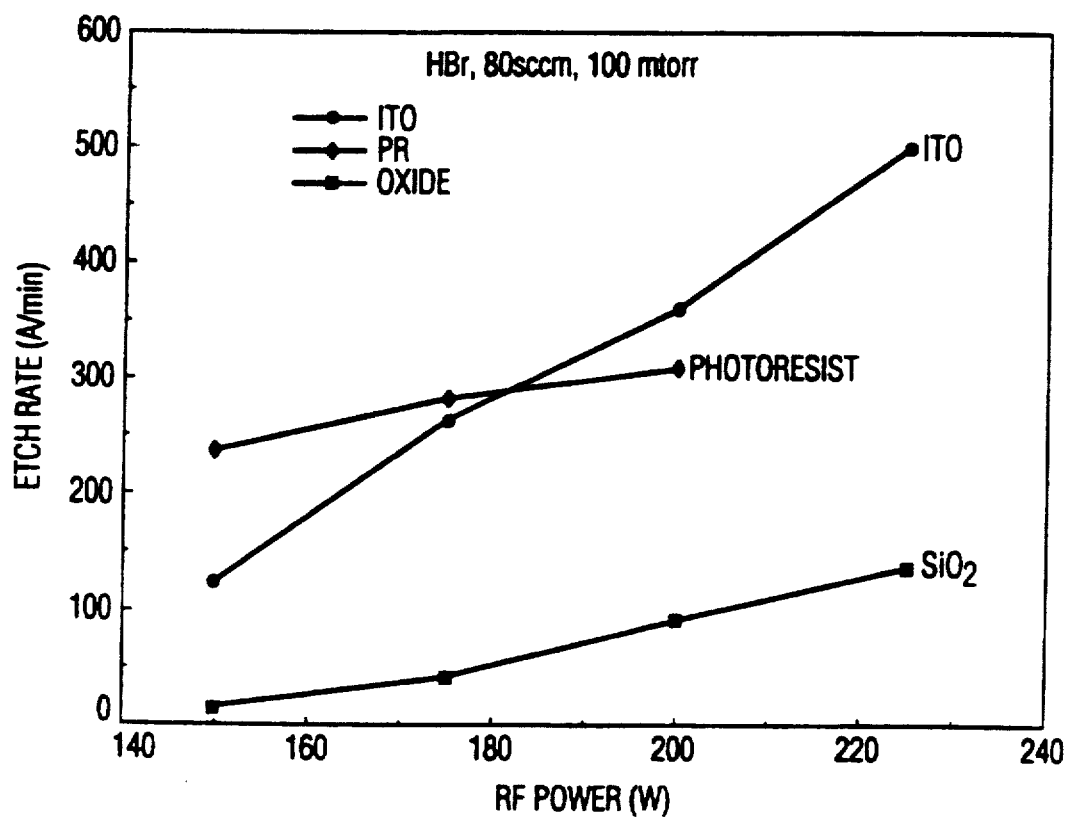
FIG. 2 is a graph comparing the etch rates of ITO, silicon dioxide and a photoresist when etched according to a method of the invention.

The etch rate for layer of ITO, the photoresist of the example and silicon dioxide for an RF power of 150, 175, 200 and 225W is shown in the graph of FIG. 2.

I claim:

1. A method of etching a thin layer of indium tin oxide deposited on a substrate comprising subjecting said layer of indium tin oxide to reactive ion etching in a plasma containing dissociated hydrogen bromide or a mixture of dissociated hydrogen bromide and dissociated boron trichloride.

2. The method of claim 1 wherein the plasma contains no dissociated boron trichloride.

3. The method of claim 1 wherein the plasma contains dissociated hydrogen bromide and dissociated boron trichloride.

4. The method of claim 2 wherein the plasma contains in addition a non-reactive gas selected from the group consisting of Ar, He and $N_2$.

5. The method of claim 3 wherein the plasma contains in addition a non-reactive gas selected from the group consisting of Ar, He and $N_2$.

6. The method of claim 2 wherein the etching is carried out at a pressure of 50–200 m Torr, RF power of 100–500W and at a gas flow rate of 10 ~ 100 SCCM.

7. The method of claim 2 wherein the indium tin oxide is deposited on a thin layer of silicon dioxide provided on a substrate of silicon.

8. The method of claim 2 wherein the indium tin oxide is deposited on a thin layer of silicon dioxide provided on a substrate of silicon.

9. The method of claim 2 wherein the substrate is a silicon dioxide essentially free of quartz.

10. The method of claim 2 wherein the substrate is quartz and an electrically conductive layer is provided on the quartz substrate prior to the deposition of the ITO layer.

11. The method of claim 3 wherein the substrate is quartz.

12. The method of claim 3 wherein the etching is carried out with a gas flow containing HBr and $BCl_3$ in a ratio by volume of 1:10 to 10:1.

13. The method of claim 12 wherein the etching is carried out at a pressure of 50–200 m Torr, RF power of 100–250W and a gas flow of 10 ~ 100 SCCM.

14. The method of claim 13 wherein the substrate is a layer of silicon dioxide on a silicon substrate.

15. The method of claim 13 wherein the substrate is quartz.

16. A method of forming a fine transparent, electrically conductive pattern of indium tin oxide on an electrically insulating substrate, said method comprising:
   (a) depositing a thin transparent layer of indium tin oxide on said substrate,
   (b) forming a photoresist having the desired pattern on said layer of indium tin oxide to thereby provide exposed sections of said layer of indium tin oxide corresponding to said pattern,
   (c) exposing said exposed sections of indium tin oxide to reactive ion etching in a plasma containing a mixture of dissociated hydrogen bromide and dissociated boron trichloride for a time sufficient to remove said exposed sections of indium tin oxide from said substrate, and (d) removing said photoresist.

17. The method of claim 16 wherein the substrate is quartz.

18. The method of claim 17 wherein the etching is carried out with a gas flow containing hydrogen bromide and boron trichloride in a ratio by volume of 1:10 to 10:1, and a non-reactive gas in a percent by volume of 1 to 99%, a gas flow of 10-100SCCM, a pressure of 100-200 mTorr and an RF power of 100-250 W.

19. The method of claim 18 wherein the non-reactive gas is selected from the group consisting of noble gases and nitrogen.

20. The method of claim 19 wherein the layer of indium tin oxide is provided by sputtering.

21. The method of claim 16 wherein the plasma is free of dissociated boron trichloride.

22. The method of claim 21 wherein the layer of indium tin oxide is provided on a thin layer of silicon dioxide which layer of silicon dioxide is provided on a silicon substrate.

23. The method of claim 22 wherein the etching is carried out with a gas flow containing dissociated hydrogen bromide and a nonreactive gas in a percent by volume of 1 to 99%, a gas flow of 10-100SCCM, a pressure of 100-200 mTorr and a RF power of 100-500 W.

24. The method of claim 23 wherein the nonreactive gas is selected from the group consisting of the noble gases and nitrogen.

* * * * *